United States Patent [19]

Cranford, Jr. et al.

[11] Patent Number: 4,638,464

[45] Date of Patent: Jan. 20, 1987

[54] CHARGE PUMP SYSTEM FOR NON-VOLATILE RAM

[75] Inventors: Hayden C. Cranford, Jr., Apex; Stacy J. Garvin, Durham, both of N.C.

[73] Assignee: International Business Machines Corp., Armonk, N.Y.

[21] Appl. No.: 551,450

[22] Filed: Nov. 14, 1983

[51] Int. Cl.⁴ ............................................. G11C 11/24
[52] U.S. Cl. .................................................. 365/226
[58] Field of Search ........................ 365/226, 227, 228

[56] References Cited

U.S. PATENT DOCUMENTS 4,322,643  3/1982  Preslar .
4,534,018  8/1985  Eckert et al. ........................ 365/228

Primary Examiner—James W. Moffitt

Attorney, Agent, or Firm—Joscelyn G. Cockburn

[57] ABSTRACT

A voltage generating system provides a plurality of different voltages for powering a dynamic nonvolatile random access memory (NVRAM) chip. The voltage generating system includes a pair of charge pumps. Each charge pump is coupled to a controller that senses the voltage level at the output of the charge pump and generates an enabling signal when said voltage is at a predetermined value. The signal activates a power down circuit which adjusts the charge pump output to a desired voltage level. A programmable oscillator provides the clocking signals for the controller. The charge pumps and programmable oscillators are periodically deactivated. As a result, the overall power consumption of the chip is reduced.

7 Claims, 14 Drawing Figures

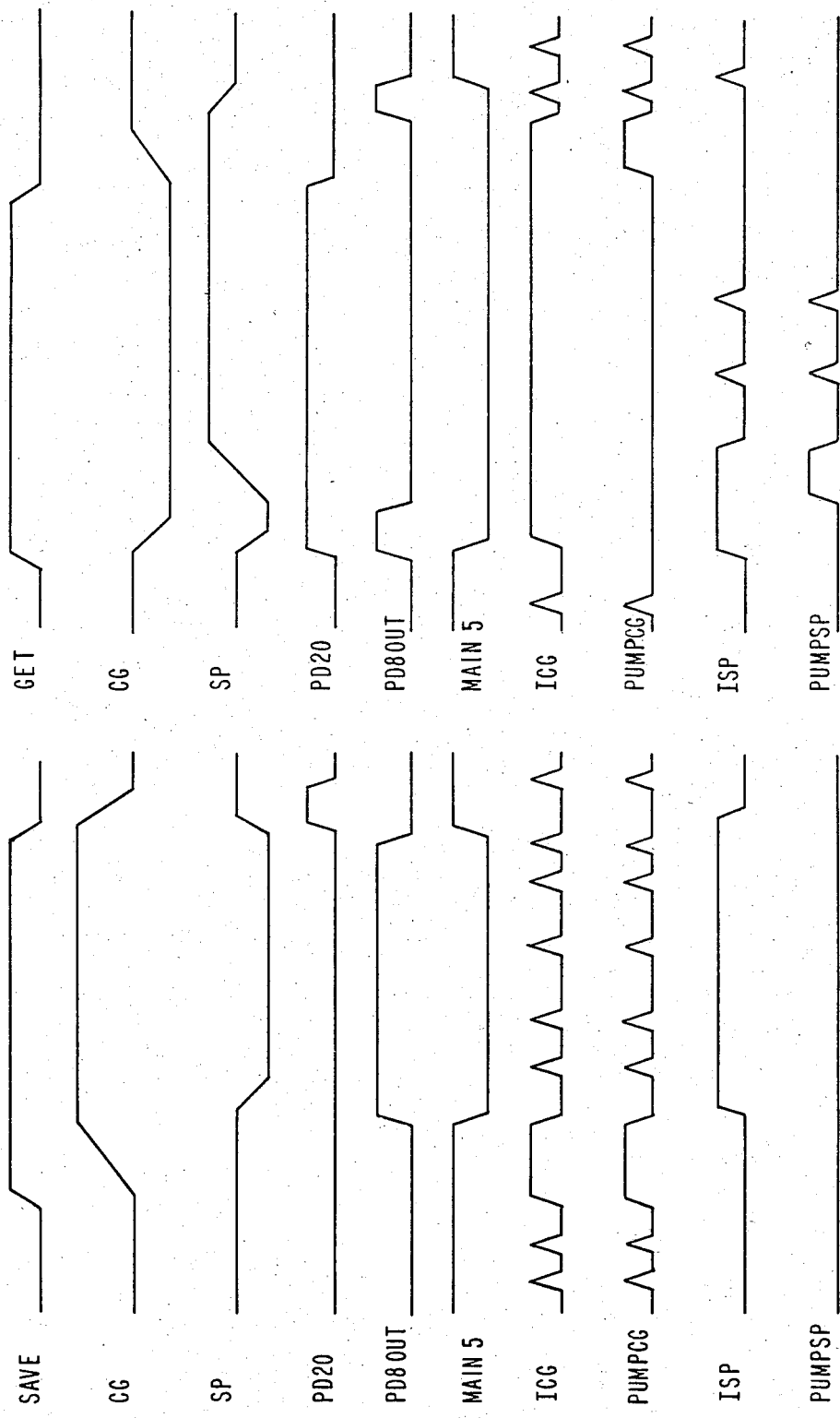

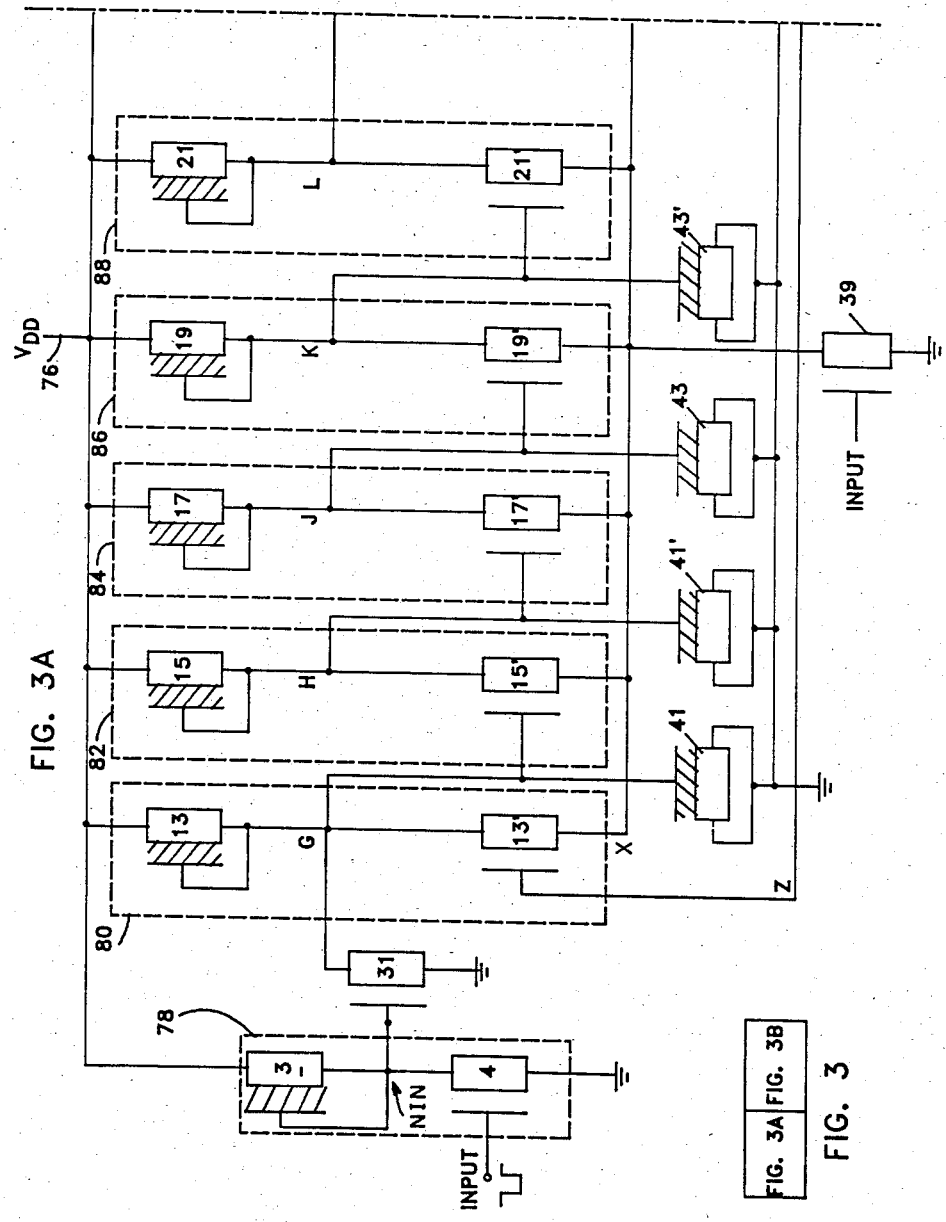

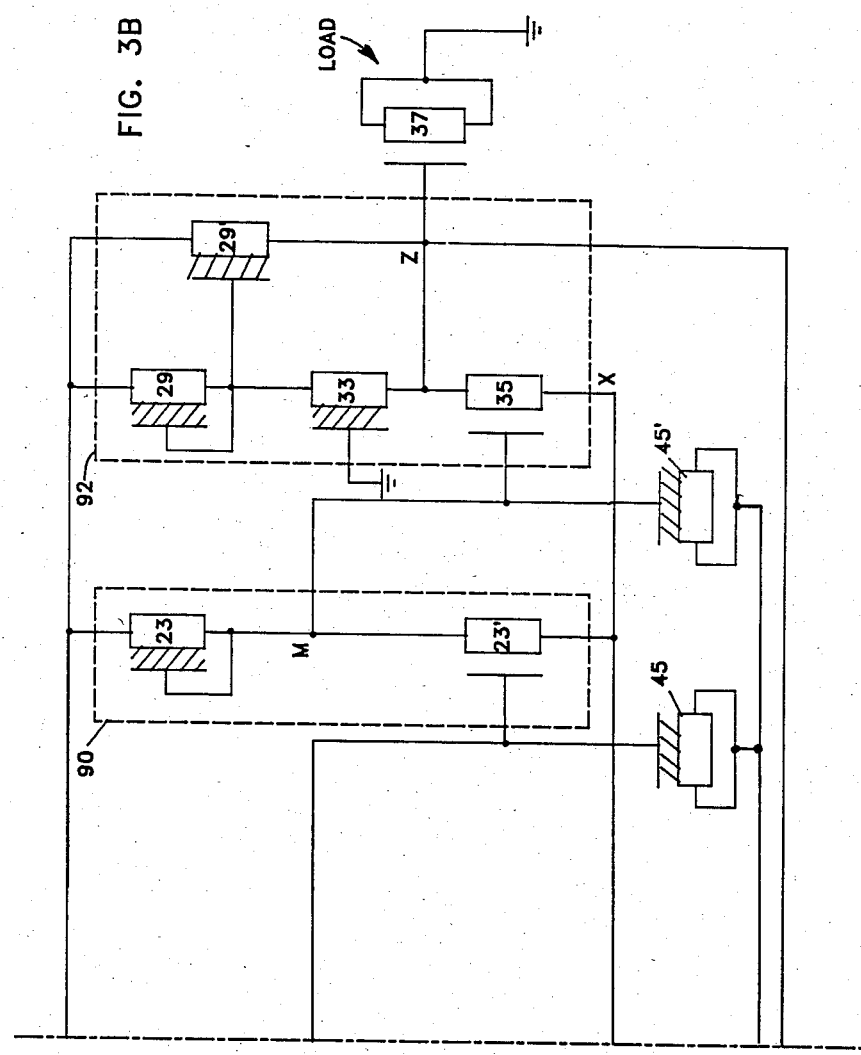

| FIG.4A | FIG.4B |

CHARGE PUMP SYSTEM FOR NON-VOLATILE RAM

BACKGROUND OF THE INVENTION (a) Field of the Invention

The invention relates to Integrated Circuit (IC) technology in general and more particularly relates to the use of semi-conductor devices to form voltage generators on an IC chip.

(b) Prior Art

The static non-volatile RAM chip and the newly developed dynamic non-volatile RAM chip are two types of semiconductor components which are used in conjunction with the processing of data. These components are usually used as memory elements. A typical static non-volatile RAM chip consists of a plurality of static non-volatile RAM cells. A typical non-volatile RAM cell consists of an EE PROM (Electrical Erasable Programmable Read Only Memory) cell connected to a latch. The latch is formed from a plurality (usually four) FETs connected in a cross-coupled configuration. Single FET control devices are connected to each half of the latch.

Usually, an on-chip voltage generator is provided for NVRAM. The generator produces a voltage which is needed for the operation of the non-volatile cell. Most of the non-volatile static RAM chips require only one high voltage level (e.g., above plus 5 volts) for programming or erasing. The classical electrical circuitry used to provide the high voltage level is a free-running oscillator and a charge pump. The charge pump is made to run in an open-ended manner or is clamped at a predetermined voltage. A more detailed discussion of prior art covering the non-volatile static RAM is given in an article entitled, "A 5 V-Only 16K EE PROM Utilizing Oxynitride Dielectrics and E PROM Redundancy," A. Gupta et al, p. 184 of the 1982 Digest of Technical Papers from the International Solid-State Circuit Conference. Another article entitled, "A Single 5 V Supply Non-Volatile Static RAM," Joseph Drori et al, p. 148 of the 1981 Digest of Technical Papers for the International Solid State Circuits Conference, gives an example of prior art non-volatile static RAM.

One of the drawbacks of the non-volatile static RAM is that it is a relatively low density device. The low density is due, in part, to the fact that a relatively large number of FET devices are used to form the cells of the non-volatile static RAM. A device which uses fewer FET devices will certainly yield a denser module.

The non-volatile dynamic RAM uses fewer FET devices and therefore provides a denser module. The newly developed non-volatile dynamic RAM cell consists of an EE PROM cell connected to a storage capacitor. One of the capacitor plates is attached to a fixed voltage and the other is coupled to an FET control device. The FET control device is also coupled to a sense amplifier. The sense amplifier senses the charge on the capacitor and when necessary initiates a refresh cycle for charging the cell.

Because of the density and other inherent characteristics, the non-volatile dynamic RAM utilizes a more complex voltage generating system than the non-volatile static RAM. The dynamic RAM voltage generating system must provide a plurality of different voltage levels. To this end, the rather simple voltage generating system which is used to drive the non-volatile static RAM cell cannot be used to drive the non-volatile dynamic RAM cell.

SUMMARY OF THE INVENTION

Because of the unavailability of a suitable on-chip multi-level voltage generating system, it is the general object of the invention to provide such a system.

Particularly, the present voltage generating device provides different high level voltage signals, a normal operating level signal and a ground level signal. The device includes two charge pump systems controlled to operate asynchronously. One of the charge pump systems provides voltages for the storage plate (SP) of the non-volatile dynamic RAM cell and the other provides voltages for the control gate (CG) of the cell. Each charge pump system includes a programmable oscillator, a control circuit, a charge pump, power down logic and a power down circuit. The control circuit is responsive to two externally generated signals. It is provided with means for sensing a voltage at the charge pump output and generates a sequence of control signals. One of the signals is used to control the oscillator which in turn supplies a clocking signal to the control circuit. Another one of the control signals is used to regulate the charge pump and still another one of the control signals is used to control the power down logic. The power down logic generates an enabling signal which activates the power down circuit. The power down circuit discharges the charge pump so that the voltage on the storage plate and control gate is returned to and maintained at a desired level after programming.

The foregoing features and advantages of the invention will be more fully described in the accompanying drawings.

BRIEF DESCRIPTION OF THE DRAWINGS

FIGS. 2A and 2B show timing diagrams for the voltage generating system of FIG. 1. The timing diagrams are helpful in understanding the operation of the voltage generating system.

FIG. 3 shows a block diagram of FIGS. 3a and 3b which show a circuit diagram for an oscillator which provides clocking signals for the voltage generating system of FIG. 1.

DETAILED DESCRIPTION OF THE PREFERRED EMBODIMENT

The present invention is intended to be used with many types of circuit modules. It works well with a non-volatile dynamic RAM cell, and as such will be described in that environment. However, this should not be construed as a limitation of the scope of the present invention since it is within the skill of one skilled in the art to make minor changes without departing from the spirit and scope of the present invention.

Figure 1:
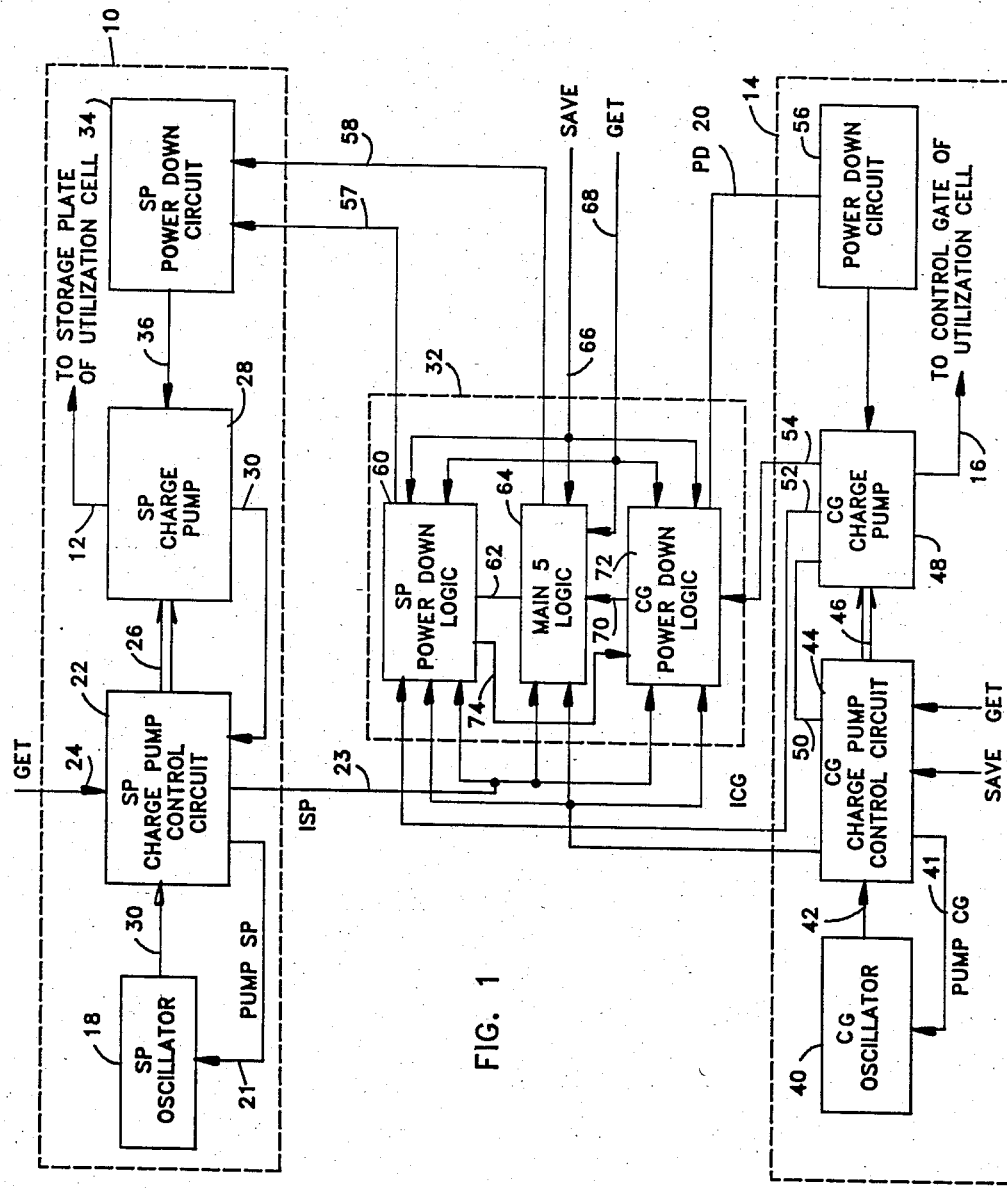
FIG. 1 shows a system block diagram for a voltage generating system according to the teaching of the present invention.

FIG. 1 shows a system block diagram according to the teaching of the present invention. A detailed description of each block will be given subsequently. The power generating system includes a charge pump system identified by numeral 10. The function of the charge pump system 10 is to generate a plurality of different voltage levels on conductor 12. The different voltage levels are generated in response to an externally generated control signal "GET." The different voltage levels on conductor 12 are supplied to the storage plate (not shown) of a utilization cell or device. In the preferrred embodiment of this invention the utilization cell is a non-volatile dynamic RAM. The externally generated signal GET is supplied to the charge pump system 10 when a particular voltage level is needed on the storage plate (SP) of the non-volatile RAM.

In addition to the voltage requirement of the storage plate, the control gate (CG) of the non-volatile dynamic RAM also requires a multiplicity of different voltage levels. These are supplied from a second charge pump system identified by numeral 14. The multiplicity of voltage signals are delivered to the control gate by conductor 16. A second externally generated control signal "SAVE" is supplied to the charge pump system 14 when a desired voltage level is needed on the control gate.

For brevity of description, the storage plate will be identified as SP. Likewise, the control gate will be identified as CG. The charge pump means 10 includes SP oscillator 18. As is used hereinafter, SP identifies devices which are dedicated to provide voltages for the storage plate of the utilization cell. A detailed description of the SP oscillator will be given hereinafter. Suffice it to say that it is a programmable oscillator and provides the clocking pulses on conductor 30 to drive SP charge pump control circuit 22. A control signal "pump SP" is supplied on conductor 21. This signal is used to control the operation of the SP oscillator.

As stated previously, the "GET" externally generated control signal is supplied on conductor 24 to the SP charge pump control circuit. The SP charge pump control circuit generates a two-phase control signal and supplies them on conductor 26 to the SP charge pump 28. A feedback signal from SP charge pump 28 is fed back on conductor 30 to the SP charge pump control circuit 22. Another control signal identified as "$I_{SP}$" is outputted on conductor 23. The $I_{SP}$ signal indicates when the SP is powered down to a predetermined voltage level. In the preferred embodiment a predetermined voltage level is 5 volts. The signal is fed into the power down logic circuit means identified by numeral 32. The function of logic means 32 is to monitor signals outputted from the control circuits and to generate appropriate enabling signals which activate the various power down circuits (to be described subsequently) and pull down the voltage level on the storage plate and/or the control gate. To this end the state of the signal on conductor 23 indicates when the voltage level on the storage plate needs to be changed or adjusted.

The function of SP charge pump 28 is to generate the appropriate voltage for the storage plate (not shown) of the utilization cell. SP charge pump 28 is a conventional capacitive type charge pump which accepts a multi-phase signal on conductor means 26 and generates an appropriate voltage level at its output. This type of charge pump is well known in the prior art and a detailed description will not be given. Suffice it to say that as the signal moves along the cascaded capacitor stages, the voltage following the principle of voltage bootstrapping, is increased. When the voltage reaches a predetermined level the SP control circuit 22 deactivates charge pump 28. The control circuit 22 will reactivate the charge pump 28 as needed to maintain the proper voltage on conductor 12.

Still referring to FIG. 1, charge pump system 14 supplies the voltages for the control gate (CG). To this end, the components which interact to provide the voltages are identified with the label CG. Charge pump system 14 includes CG oscillator 40 with an input control signal "pump CG" connected thereto on conductor 41 and its output connected through conductor 42 to CG charge pump control circuit 44. The CG charge pump control circuit 44 generates a control signal "ICG" which is supplied on conductor ICG to the logic means 32. The two-phase output signal from CG charge pump control circuit 44 is supplied on conductor 46 to CG charge pump 48.

A pair of externally generated control signals identified as "SAVE" and "GET" are supplied to CG charge control circuit 44. Depending on the state of the signals, the charge pump is controlled to satisfy the requirement of these externally generated signals. The output from CG charge pump 48 is fed on conductor 16 to the control gate of the utilization cell (not shown). A feedback signal is fed from CG charge pump 48 on conductor 50 to the CG charge pump control circuit 44. Other control signals are fed on conductors 52 and 54, respectively, to the logic circuit means 32. The function of CG oscillator 40, CG charge pump control circuit 44, CG charge pump 48 and power down circuit 56 is similar to the function performed by the comparable devices in charge pump system 10. Since those functions have already been described, they will not be repeated here.

Still referring to FIG. 1, logic means 32 monitors the externally generated "SAVE" and "GET" signals, $I_{SP}$, $I_{CG}$ and other signals on conductors 52 and 54 and generates control signals on conductors 57, 58 and PD20. These signals are used to activate the power down circuit. To this end, the logic means 32 includes SP power down logic 60, main 5 logic 64, and CG power down logic 72. The input of SP power down logic 60 is coupled by conductors 23, $I_{CG}$ and 52 to SP charge pump control circuit 22, CG charge pump control circuit 44 and CG charge pump 48, respectively. The SP power down logic 60 generates a control signal "PD8 out" which is supplied on conductor 57 to activate the SP power down circuit. Another conductor 62 couples SP power down logic 60 to main 5 logic 64.

The function of main 5 logic 64 is to generate a control signal which is supplied on conductor 58 and inform SP power down circuit 34 that a 5 volt voltage level must be maintained on the storage plate of the utilization cell. This 5 volt level is supplied through a low resistance path to the input power source $V_{dd}$. The main 5 logic 64 is supplied with control signals on conductor 23, ICG, and the "SAVE" and "GET" signals on conductors 66 and 68, respectively. The main 5 logic 64 is connected by conductor 70 to CG power down logic 72.

The function of CG power down logic 72 is to generate a control signal "PD 20" and supply the same on conductor PD 20 to the CG power down circuit. The CG power down logic 72 is connected by conductor 54 to CG charge pump 48. The externally generated "SAVE" and "GET" control signals are delivered to CG power down logic 72 on conductors 66 and 68. Conductor 74 interconnects CG power down logic 72 with SP power down logic 60. Also, conductor 23 and ICG interconnect CG power down logic 72 to SP charge pump control circuit 22 and CG charge pump control circuit 44, respectively. Having described the functional components of the power generating system according to the teaching of the present invention, the operation of the overall system will now be given.

FIG. 2 shows a timing diagram for the system and will be used to describe the operation of the system. Similar names are used to identify common signals on the timing chart and in FIG. 1, respectively. The subject voltage generating system requires three external signals, namely: a power signal ($V_{dd}$) (to be described hereinafter), and the "SAVE" and "GET" control signals. These signals are supplied to the voltage generating system, of the present invention, when a particular voltage is needed on the storage plate and/or the control gate of the utilization cell.

Initially, the control gate (CG) is maintained at a first voltage level, say 8.5 volts, and the storage plate (SP) is held at a second voltage level, say $V_{dd}$, voltage level which is approximately 5 volts. In this state, the control gate (CG) charge pump 48 (FIG. 1) delivers 8.5 volts on conductor 16 while the +5 volts is maintained via the low resistance connection through SP power down circuit 34 to $V_{dd}$. The externally generated "SAVE" signal is now applied. The sense level of the sensing circuit associated with the control gate charge pump is raised to a predetermined voltage level. In the preferred embodiment of this invention the predetermined voltage level is 20 volts. This activates the charge pump 48 which pumps until the 20 volts sense level is reached. As will be explained subsequently, the circuit which senses the voltage on the output of the charge pump is located in the CG charge pump control circuit 44. As the 20 volt level is reached, the ICG control signal which is outputted from the CG charge pump control circuit 44 changes state. This signal is fed to the logic means 32 and indicates that the storage plate (SP) must be dropped to 0 volts. The logic activates the SP power down circuit 34 which discharges the storage plate to the desired voltage level. This signal also instructs the main 5 logic 64 to remove the $V_{dd}$ voltage signal on the storage plate.

When the "SAVE" signal is removed, the SP power down logic deactivates the SP power down circuit and instructs the main 5 logic to reconnect the storage plate to the $V_{dd}$ voltage supply.

At this time the sense level for the CG charge pump 48 sensing circuit is switched back to +8.5 volts and the CG power down circuit 56 is instructed to pull the output of the CG charge pump 48 down to 8.5 volts. When the CG charge pump reaches 8.5 volts, the power down circuit 56 is deactivated and the sense circuit (located in the CG charge pump control circuit 44) insures that the output remains at the 8.5 volts.

Still referring to FIGS. 1, 2A and 2B, the other mode of operation of the voltage generating system is adopted when the externally generated "GET" signal is applied. The electrical signals representing this mode of operation are shown in FIG. 2B. In this mode the sense level for the storage plate charge pump 28 is raised to 8.5 volts. However, before the charge pump begins to pump up to this new level, it is disabled by the SP charge pump control circuit 22 and the SP power down circuit is activated pulling the storage plate to ground. The "GET" control signal also disables the control gate charge pump 48 and enables the power down circuit 56 to pull the output of the CG charge pump to ground. Once the control gate is fully discharged, the SP power down circuit 34 is disabled and the SP control circuit 22 activates the SP charge pump 28 which charges the storage plate to 8.5 volts.

When the "GET" signal is removed, the CG power down circuit 56 is disabled and the CG control circuit 44 activates the CG charge pump 48. With the fall of "GET", the sense point of the SP sensing circuit is reestablished at 5 volts. When the control gate reaches 8.5 volts, the SP power down circuit 34 is activated and SP begins to fall. When the SP control circuit 22 senses +5 volts on the storage plate, the SP power down circuit 34 is turned off, and the main 5 logic establishes a low resistance path to the +5 volts ($V_{dd}$) supply.

The above-described multi-level voltage generating system is "user friendly" in that it requires a minimum number of input lines. Essentially, the system requires a single-ended power supply $V_{dd}$ and two control logic signals. The system provides multiple high voltages simultaneously. The oscillators and charge pumps are switched off when the high voltages are not being delivered, thus conserving power. The charge pump levels are sensed and controlled instead of being free running. Having described the voltage generating system and its operation, the description of each individual block will now be given.

The Oscillator

FIGS. 3a and 3b show a circuit diagram of an oscillator suitable for use in FIG. 1. The oscillator to be described hereinafter may be used as the SP and/or CG oscillator. The output from the oscillator is used to provide the clocking signal which drives the charge pump control circuit. The input to the oscillator is the feedback signal identified in FIG. 1 as pump CG or pump SP. The SP and CG designation depends on whether the oscillator is coupled to the storage plate charge pump control circuit or the control gate control circuit. A power supply voltage $V_{dd}$ is supplied on conductor 76 to the oscillator. The oscillator is fabricated from FET devices. The depletion mode FETs are represented by a cross hatch section between the gate electrode and the rectangular portion of the device. The non-depletion mode devices do not have the cross hatch section.

The device includes an input inverter stage identified by numeral 78. A node identified as NIN is formed between devices 3 and 4, respectively. The node is tied to the gate of FET 31. The source electrode of device 31 is grounded and the drain electrode of device 31 is connected to node G. Node G represents the control node for the oscillator. It (that is, node G) is formed at the junction of devices 13 and 13', respectively. Devices 13 and 13' form an inverter stage of the oscillator and is identified by numeral 80. Inverter 80 is formed from a depletion mode FET 13 and a non-depletion mode FET 13'. The oscillator includes a plurality of other inverter stages identified by numerals 82, 84, 86, 88 and 90. Each stage is made up of similar electrical components as those in inverter stage 80. A node is disposed between the elements of each inverter stage. For example, node H is disposed between devices 15 and 15'. Node J is disposed between device 17 and 17' and so on.

Each of the nodes is tied to a plurality of capacitive loads identified by devices 41, 41', 43, 43', 45 and 45'. The nodes G, H, J, K, L, and M are tied to a common node X and node X is coupled through device 39 to ground. Circuit means 92 is connected to a node M. Circuit means 92 forms an inverted stage with a compound pull-up network. Its function is to create a high current flow at node Z which is tied back into device 13' to cause oscillation in the circuit. Circuit means 92 is comprised of devices 29, 31', 33 and 35. The device 37 is connected to node Z and represents the load which is driven by the oscillator. In this embodiment device 37 represents the input to the SP and/or CG charge pump control circuits 22 and 24, (FIG. 1) respectively. It has been determined that by making device 37 represent the largest portion of the circuit delay the tracking can be used to cause the oscillator to have a higher or lower frequency.

In operation, when the input is down, node G is held at ground by device 31. Device 39 is held off. This breaks the conductive path to ground allowing the internal nodes to float high. In this state the oscillator is stopped and power is not being dissipated.

When the input rises, Node X is grounded through device 39. After one inverter delay (caused by devices 3 and 4) the gate of device 31 is grounded and node G is released allowing it to be charged by device 13. This aids in starting the oscillation by causing instability at node G. Devices 41, 41', 43, 43', 45 and 45' form capacitive loads and control the circuit delays and hence the frequency of oscillation. Devices 29, 29', 33, and 35 form an inverter with a compound pull-up network. When node Z goes above a depletion threshold above ground, node Y charges rapidly to a predetermined voltage, say 5 volts. This provides a large gate drive voltage to drive device 29', and the output rises quickly. Oscillation is enabled by the fact that the feedback path goes from the output to the gate of device 13'.

Frequency of oscillation is determined by the summation of inverter delays through the circuit. In the preferred embodiment of this invention, the delays are due to the switching speed of the individual inverters. This switching speed is in turn governed by the various nodal capacitances. The period (1/f) relating to frequency of oscillation is:

$T = 2(Y_1 + Y_2 + \ldots Y_n)$ where $Y_n$ represents an individual inverter delay. Therefore, $f = 1/2\Sigma Y_n$ This expression holds true for an oscillator of any given number of inverters. In the case of the oscillator shown in FIGS. 3a and 3b, the last inverter delay is controlled by the output capacitance of the circuit being driven. This output capacitance is mainly composed of the gate capacitance of the input of the circuit being driven. In FIG. 3 this is shown by device 37. If device 37 represents the largest portion of the circuit delay, the tracking of the device can be used to cause the oscillator to have a higher frequency when the circuit being driven utilizes a short channel FET as its input device and to have a lower frequency when the processing causes this device to have a longer channel. The shorter channel implies a greater width/length ratio and hence the ability to conduct more current. This will enable (due to device matching) the circuit being driven to operate at a higher switching speed.

Thus, by using the output load to provide a sizable portion of the total oscillator delay, the oscillator provides a higher frequency when the circuit being driven can be switched at this higher frequency. Likewise, the oscillator provides a lower frequency when the circuit being driven can only be switched at the lower frequency. In essence, the frequency of oscillation tracks the switching speed of the load.

Additionally, the oscillator can be started and stopped under logic control. No power is dissipated when the oscillator is in the off state.

Charge Pump Control Circuit

Figures 4, 4A:
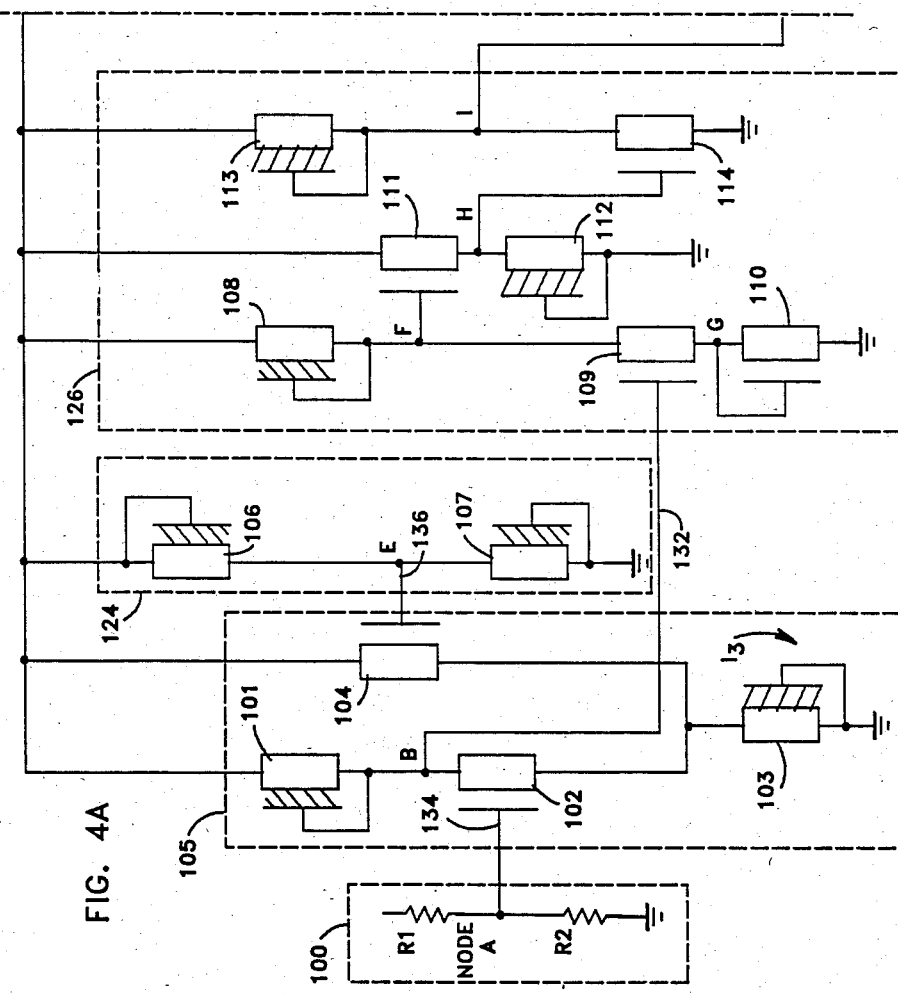
FIG. 4 shows a block diagram of FIGS. 4a and 4b which show a circuit diagram for the charge pump control circuit.
Figure 4B:
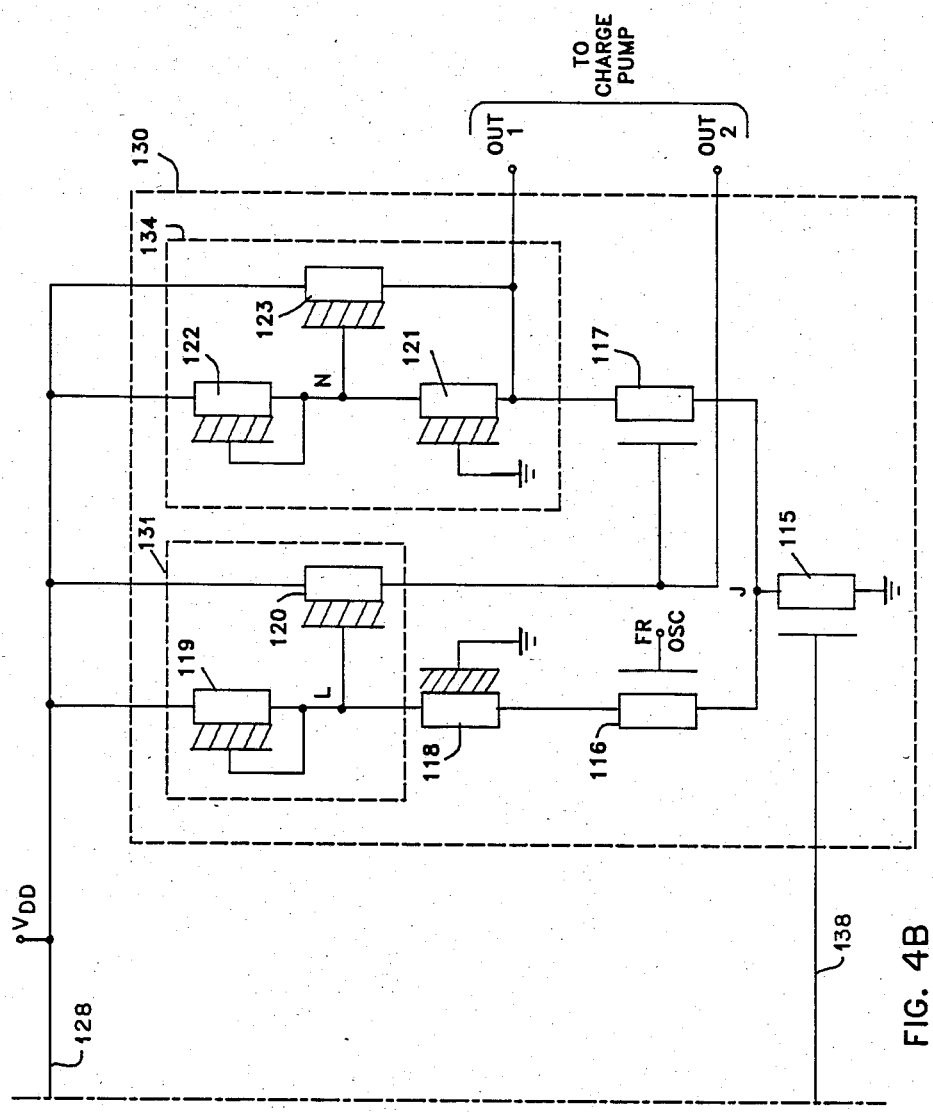

FIGS. 4a and 4b show the detail of the charge pump control circuit which is used for driving the charge pumps in FIG. 1. This circuit can be used for driving either the storage plate (SP) charge pump or the control gate (CG) charge pump. The output from the oscillator described in FIGS. 3a and 3b is fed into the gate electrode of device 116. The sensing means identified by numeral 100 is coupled to the output of the charge pump. By way of example, if the circuit is used to drive the SP charge pump sensing means 100 is coupled to the output of the SP charge pump. Likewise, if the control circuit drives the control gate charge pump, sensing means 100 is coupled to the output of the control gate charge pump. Sensing means 100 is adapted to sense the voltage at the output of the charge pump. It is comprised of a pair of series connected resistors (R1 and R2). The resistors are connected to node A. In the preferred embodiment of this invention the resistors are polysilicon resistors.

A differential amplifier stage identified by numeral 105 is connected by conductor 134 to node A. The differential amplifier stage compares the signal appearing at node A to a voltage reference to be mentioned hereinafter. The differential amplifier stage is comprised of FET devices 101, 102, 103 and 104. The source electrodes of devices 101 and 104, respectively, are tied to node 128. Node 128 is connected to the $V_{dd}$ voltage supply. A voltage reference means identified by numeral 124 is connected by conductor 136 to the gate electrode of device 104. The voltage reference means is comprised of FET devices 106 and 107. These devices are connected to place a reference voltage at node E. A level shifting and voltage translation means identified by numeral 126 is connected by conductor 132 to node B. The level shifting and voltage translation means 126 provides a level shifting and voltage translation function to a voltage at node B. The level shifting and voltage translation means 126 is formed from FET devices 108 through 114. Device 114 functions as a switch which in turn controls device 115. Device 115 controls the output stage 130. The output stage 130 supplies the signals OUT 1 and OUT 2 which are used to drive the charge pump.

Still referring to FIGS. 4a and 4b, the output stage 130 is connected by conductor 138 to node I of level shifting and voltage translation means 126. The output stage 130 includes pull-up networks 132 and 134, respectively. Pull-up network 131 is used to control OUT 2. Likewise, pull up network 134 is used to control OUT 1. The output stage 130 together with the pullup networks are fabricated from FET devices 115 through 123.

Still referring to FIGS. 4a and 4b, in operation, R1 and R2 form a voltage divider between the output of the charge pump and ground. Devices 101, 102, 103 and 104 form a differential amplifier stage. Devices 106 and 107 form a stable voltage reference at node E. Stability is achieved by using depletion devices for both devices 106 and 107. This also provides threshold tracking. In addition, both devices are made large enough to avoid some of the effects of width to length variations.

As the charge pump output rises, node A rises at a rate determined by the ratio of R1 to R2. As device 102 begins to conduct, node B falls. When node B falls below two enhancement threshold voltages, device 109 is switched off causing node F to rise. As node F rises above the sum of the threshold devices 111 and 114, the device 111 turns on first, charging node H. Device 112 is a low current leakage device, the purpose of which is to discharge node H when device 111 is switched off. When the output stage 130 is to be switched off, then device 114 is turned on pulling the gate of device 115 to ground. This disables the current path to ground of the output stage and allows output 1 and output 2 to float high. This insures that when the device is off, power is not dissipated.

The fact that the outputs (OUT 1 and OUT 2) of the charge pump driver can be turned off once a desired voltage level is attained, allows the use of much larger devices than could otherwise be used. This makes the circuit suitable for driving higher capacitive loads at higher frequency. This feature is important in the design of large charge pumps.

Still referring to FIGS. 4a and 4b, device 115 is on when the two phase output (OUT 1 and OUT 2) are being supplied to the charge pump. In this mode of operation power conservation is achieved as follows. Pull-up networks 131 and 134 are used instead of a single pull up device to control OUT 1 and OUT 2. For example, in the case of phase 1, as OUT 1 rises above a depletion threshold above ground, device 121 turns off. Node N then rises rapidly to $V_{dd}$. This supplies a large amount of gate drive to device 123. This provides a fast output rise time. When output 1 is at its low level, node N is also low. This reduces power consumption. A similar analysis will show that a fast output rise time is also available at OUT 2, with a low voltage level at node L when OUT 2 is off.

As node B begins to fall, devices 102 and 104 are in the saturation region of operation. Hence, these devices appear as voltage dependent current source and can be represented by the following mathematical equation:

$$I_{104} = \frac{\partial_{104}}{2} \frac{W_{104}}{L_{104}} (V_{gs104} - V_t)^2$$

$$I_{102} = \frac{\partial_{102}}{2} \frac{W_{102}}{L_{102}} (V_{gs102} - V_t)^2$$

where 102 and 104 identify devices 102 and 104.
I represents the current flow.
$\partial$ represents the transconductance.
L represents the effective device length.
W represents the effective device width.
$V_{gs}$ represents the gate to source voltage.
$V_t$ represents device threshold voltage.

Device 103 will only operate in the linear region; hence, it is represented by the following equation:

$$I_{103} = \partial_{103} \frac{W_3}{L_3} \left( V_{gs103} - V_t - \frac{V_{ds103}}{2} \right) V_{ds103}$$

where $V_{ds}$ represents the drain to source voltage.

It is worthwhile noting that $I_{103}$ is dependent on $V_{ds}$. Device parameters of 102 and 104 track and an increase in $V_{T104}$ brings a corresponding decrease in $I_{104}$. This in turn decreases the voltage across device 103 (i.e., $V_c$). This increases the gate drive required to turn device 102 on and compensates for the increase of $V_{T102}$.

Threshold voltage changes of devices 109 and 110 help to compensate for the changes in threshold of devices 111 and 114, respectively. As $V_{T109}$ and $V_{T110}$ decrease, node F tends to rise later since node B has farther to fall in order to be below two enhancement device thresholds. To counter this, because of device matching, the threshold of device 111 and device 114 are also decreasing. Consequently, node F does not need to rise as far to turn devices 111 and 114 on and 115 off. Thus, process variations in this portion of the circuit are somewhat transparent.

Several benefits inure to the user of the circuit. The circuit provides very low power dissipation when the output of the charge pump is to be turned off. Device parameter tracking is utilized to achieve accurate charge pump control. Low voltage can be used on the input gate of the control circuit differential amplifier due to the use of the polysilicon resistor divider in the front end of the sensing circuit. Fast rise time of the charge pump output can be achieved without losing control of the end voltage level or sacrificing power.

CG POWER DOWN CIRCUIT

Figure 5:
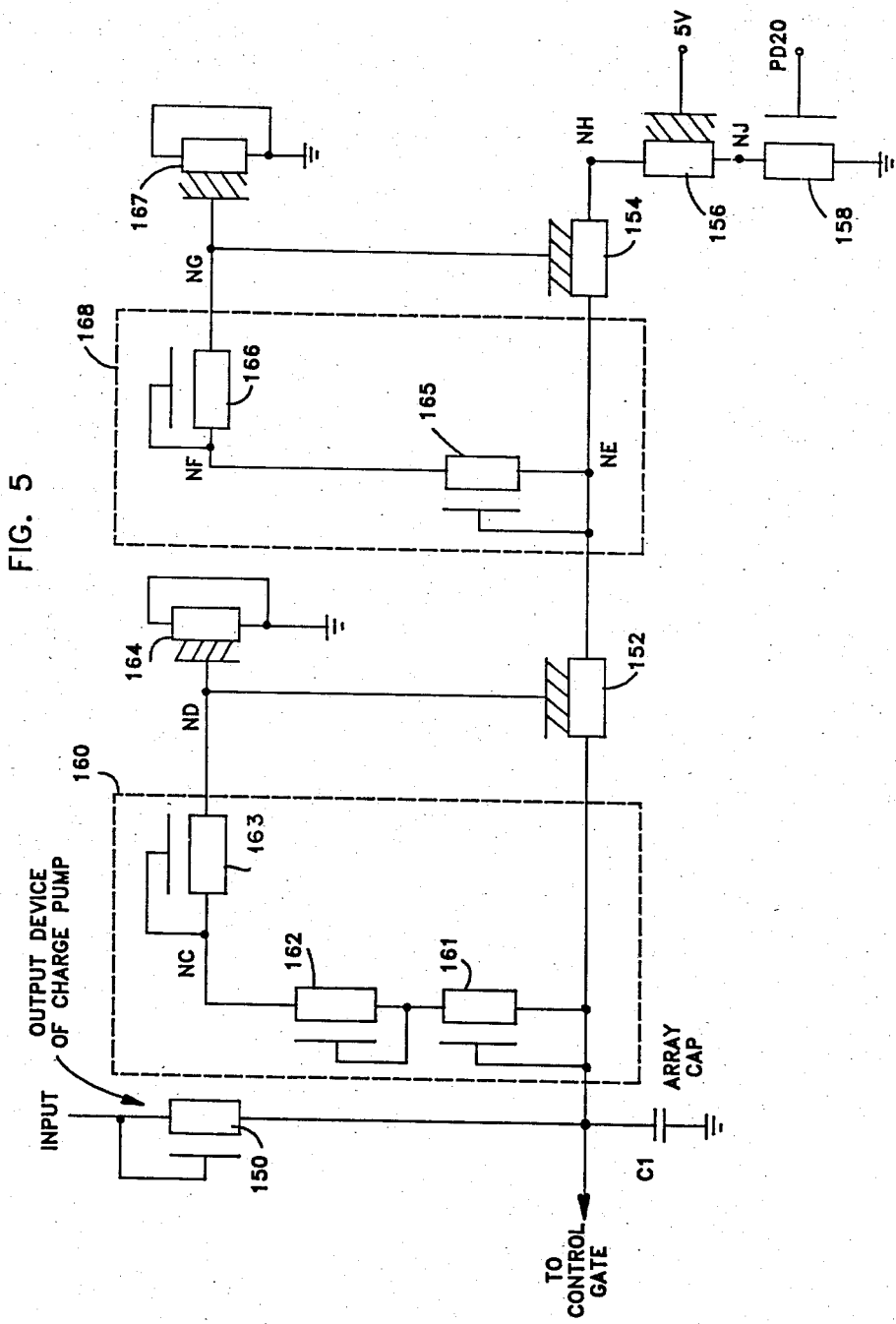
FIG. 5 shows a circuit diagram for powering down the control gate (CG) charge pump.

FIG. 5 shows the circuit schematic for the CG power down circuit 56 (FIG. 1). In the circuit, device 150 represents the output device of the charge pump 48 (FIG. 1). Likewise, capacitor C1 represents the total control gate (in the non-volatile RAM array) capacitance. Devices 152 through 158 interconnect the output of the charge pump to ground. A biasing means identified by numeral 160 is connected to the gate of device 152. The biasing means 160 is comprised of FET devices 161 through 163. Device 164 provides a capacitive holding action and is connected between the gate of device 152 and ground. In a similar manner biasing means 168 is connected between the drain and gate electrode of device 154. Biasing means 168 is comprised of devices 165 and 166, respectively. Device 167 provides a capacitive holding action and is connected between the gate of device 154 and ground. The function of the power down circuit is to adjust the voltage at the output of CG charge pump 48.

During a power down cycle the conductive path between the output of the charge pump and ground is provided by devices 152, 154, 156 and 158. Prior to and during power down, the high voltage at the output of the charge pump can be dropped evenly across these four devices providing that their gates are properly biased. Devices 161, 162 and 163 provide such a bias to the gate of device 152. Node ND is connected to the gate of device 152 and is thus charged to a voltage which is three FET thresholds below the charge pump output. Because node ND is only connected to FET gates, there is no DC loading of the charge pump output.

Similarly, devices 165 and 166 provide biasing for device 154. Devices 164 and 167 provide a capacitive holding action at nodes ND and NG, respectively, as the charge pump is powered down. It should be noted that without this capacitive holding action the capacitive coupling of the large devices 152 and 154 would cause nodes ND and NG to fall and reduce current flow through devices 152 and 154, respectively. In order to rapidly discharge the control gate it is imperative that the current flow be maintained through these devices.

Device 156 with its gate connected to a predetermined voltage level, say 5 volts, serves to prevent node NJ from going higher than a depletion threshold above 5 volts. This will be approximately 7 volts. Device 158 is switched by a logic signal identified as PD 20 and is outputted from CG power down logic 72 (FIG. 1). The signal initiates the power down cycle. Since each of these FET devices (152, 154, 156 and 158) must withstand a relatively large voltage to prevent junction breakdown at each node, a protect ring technique is used. All devices, save device 158, must be completely surrounded by a field shield which is connected to a voltage high enough to prevent gate breakdown.

Several benefits inure to the user of this power down circuit. This circuit provides a means of obtaining the proper biasing voltages for a controlled voltage splitting across a series of FETs from an on-chip charge pump. The circuit does not subject the high voltage charge pump to DC loading. An optimum level of voltage to insure against device breakdown is provided across each device via the self-contained charge trapping nodes (NG and ND). This optimum level is maintained both during charge pump operation (when the power down circuit is off), and during the chip power down cycle (when the power down circuit is activated and the charge pump is deactivated).

SP POWER DOWN CIRCUIT

Figure 6:
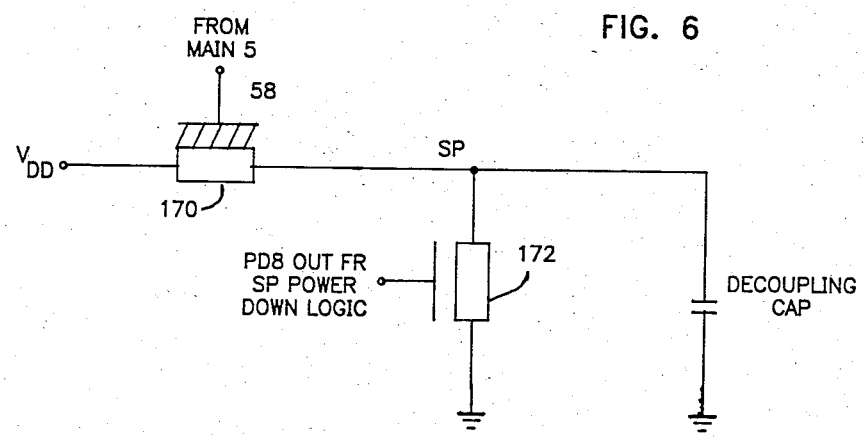
FIG. 6 shows a circuit diagram for powering down the storage plate (SP) charge pump.

FIG. 6 shows a circuit diagram for the SP power down circuit 34 of FIG. 1. The function of this circuit is to power down (that is, reduce or adjust) the voltage at the output of the SP charge pump 28 so that the voltage on the storage plate falls to a predetermined level. The circuit includes FET device 170 and FET device 172. The drain electrodes of FETs 170 and 172 are tied to the storage plate (SP). The decoupling cap in the figure represents the storage plate capacitance. The source electrode of FET device 172 is tied to ground and the gate electrode is tied to a signal identified by PD8 Out. As will be explained subsequently and can be seen from FIG. 1, PD8 Out is a logic signal which is outputted on conductor 57 from the SP power down logic means 60. The source electrode of FET device 170 is tied to the $V_{dd}$ power supply and the gate electrode is tied to conductor 58 which carries a signal from the main 5 logic means 64 (FIG. 1).

In operation when the PD8 Out signal is high, the circuit discharges the storage plate (SP). Alternatively, if the logic signal from main 5 logic means 60 which is supplied on conductor 58 is high, the storage plate is clamped to supply voltage $V_{dd}$. In essence, device 170 functions as a simple low resistance device connecting the storage plate to the supply voltage.

SP POWER DOWN LOGIC

Figure 7:
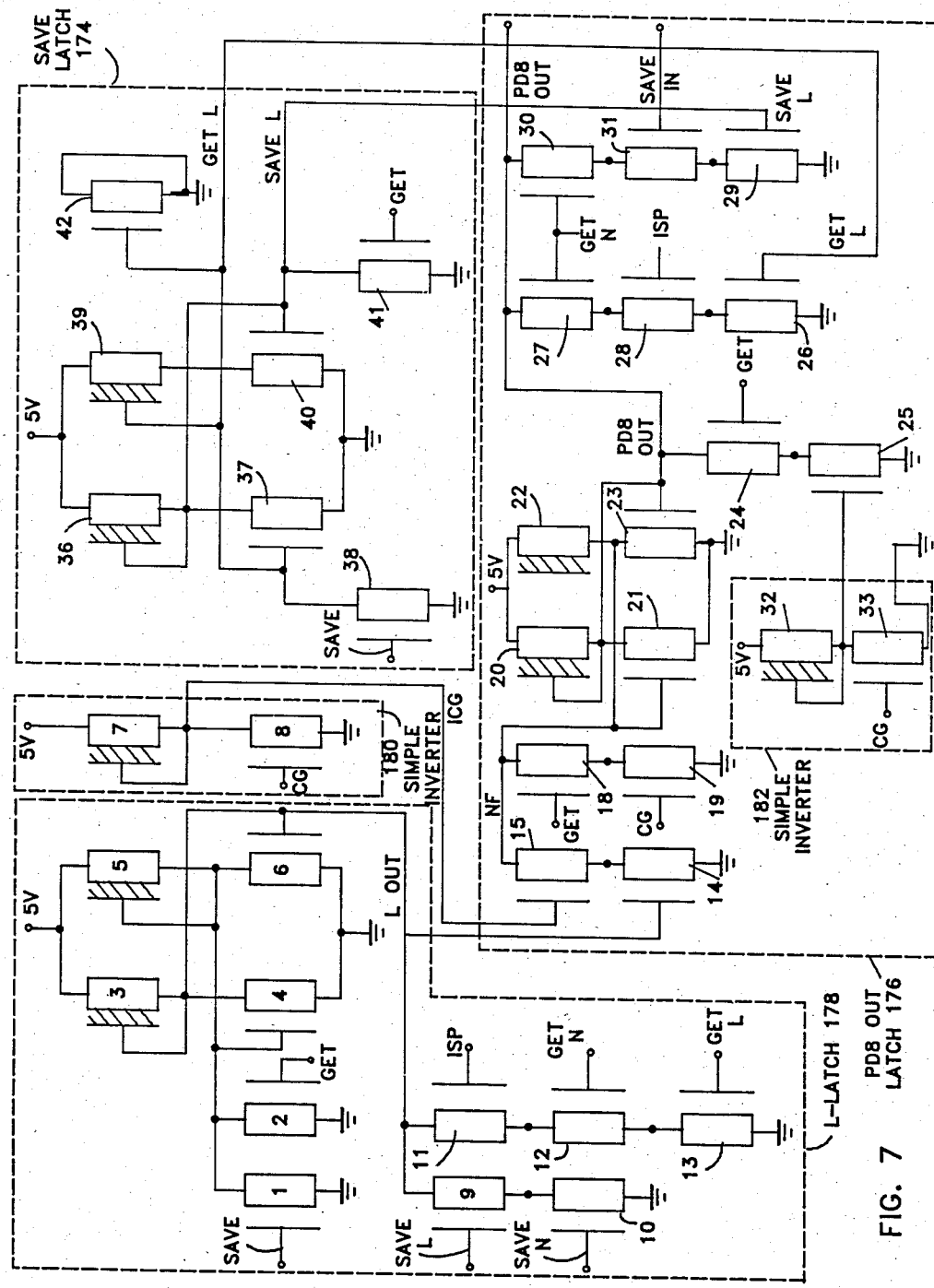
FIG. 7 shows a circuit diagram for the SP power down logic.

FIG. 7 shows a circuit diagram of the SP power down logic circuit. Its function is to generate the PD8 out control signal. This signal informs the SP power down circuit to adjust the voltage at the output of the SP charge pump (FIG. 1).

The SP power down logic is comprised of "SAVE" latch 174, PD8 Out latch 176, and L latch 178. "SAVE" latch 174 is coupled to PD8 Out latch 176. Likewise, L latch 178 is coupled to PD8 Out latch. A control signal ICG is inverted by inverter 180 and is fed into PD8 Out latch 176. Likewise, the control signal CG which is supplied on conductor 52 (FIG. 1) is fed into PD8 Out Latch 176 and is inverted by inverter 182. The function of the SP power down logic is to monitor a plurality of control signals ("SAVE," "GET", ICG, ISP, NCG) and to generate the PD8 Out signal which informs the SP power down circuit to adjust the voltage level at the output of the SP charge pump 28 (FIG. 1). Each of the latches is fabricated from FET devices connected in the manner shown in FIG. 7. Since there are several other ways of interconnecting these FET devices without escaping the gist of this invention, the detailed interconnection between each FET device will not be given. It being understood that the interconnection shown in FIG. 7 is only one of a plurality of interconnection schemes.

Still referring to FIG. 7, the function of the "SAVE" logic latch is to remember whether the "SAVE" signal or "GET" signal was the non-volatile operation performed. As was described previously, the "SAVE" and the "GET" are externally generated control signals which are supplied from the chip when a desired voltage level is needed to enable the chip to perform one of the desired functions. The "SAVE" latch also ensured that if the logic is powered up in the volatile state, "SAVE" L remains in the high state. The "SAVE" latch accepts the "SAVE" and "GET" signals respectively and outputs "SAVE" L and "GET" L signals. In operation, if the "SAVE" signal is high, "GET" L is pulled low which in turn charges "SAVE" L high. When "GET" comes high, "SAVE" L is pulled down and "GET" L goes high.

The function of the L latch is to produce a signal which basically follows the "SAVE" and "GET" signals, respectively, except that it stays high past the fall of "GET" until the storage plate is powered back to +5 volts. When the storage plate is powered back to 5 volts, the signal $I_{SP}$ on conductor 21 which is outputted from the SP charge pump control circuit 22 (FIG. 1) is activated. The L latch is supplied with control signals, "SAVE", "GET", "$\overline{\text{SAVE}}$", "$\overline{\text{GET}}$", "SAVE" L, "GET" L, and ISP. In return the L latch outputs L OUT. In operation if either the "SAVE" or "GET" signal is high then L out will likewise go high. If either "$\overline{\text{SAVE}}$" and "SAVE" L are high, or ISP and "$\overline{\text{GET}}$" and "GET" L are high, then L OUT will be pulled to ground. The latch only changes state when one of the paths to ground is actively on.

The PD8 Out latch produces the signal for powering down the storage plate. It receives the following signals: L OUT, ICG, CG, $\overline{\text{CG}}$, "GET", "$\overline{\text{GET}}$", ISP, "GET" L, "$\overline{\text{SAVE}}$", and "SAVE" L. These signals are logically manipulated and the PD8 Out signal is generated.

MAIN 5 LOGIC MEANS

Figure 8:
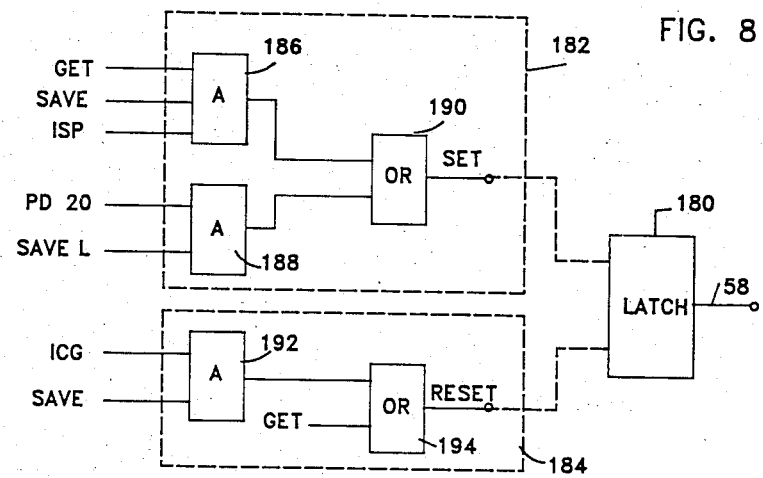
FIG. 8 shows a logic diagram for the main 5 logic.

FIG. 8 shows a logic diagram for the main 5 logic means 64 (FIG. 1). The function of the main 5 logic is to generate a signal identified as main 5 and supplies the same on conductor 58 to the SP power down circuit (FIG. 1). The signal tells the SP power down circuit to clamp the storage plate to +5 volts via a low resistance path to $V_{dd}$. The low resistance path to $V_{dd}$ is discussed above in relationship to the SP power down circuit. This signal is therefore high whenever the storage plate (SP) is not being actively pumped to a higher voltage or being pulled to ground. The main 5 logic means is comprised of a latch identified by numeral 180. The latch has a set input which is connected by a set conductor to combinatorial logic 182 and the reset input of the latch is connected to combinatorial logic 184 by a reset conductor. Combinatorial logic 182 is comprised of AND blocks 186 and 188, respectively. The AND blocks are connected over connectors to logical "OR" circuit 190. Control signals "GET", "SAVE", and ISP are supplied to the input of AND circuit 186. Likewise, control signals PD 20 and "SAVE" L are fed into AND circuit 188. These signals are manipulated to generate the signal which is used for setting latch 180. Combinatorial logic 184 is comprised of AND circuit 192 coupled to OR circuit 194. The AND circuit 192 and OR circuit 194 are used to generate a reset signal which resets latch 180.

CG POWER DOWN LOGIC

Figure 9:
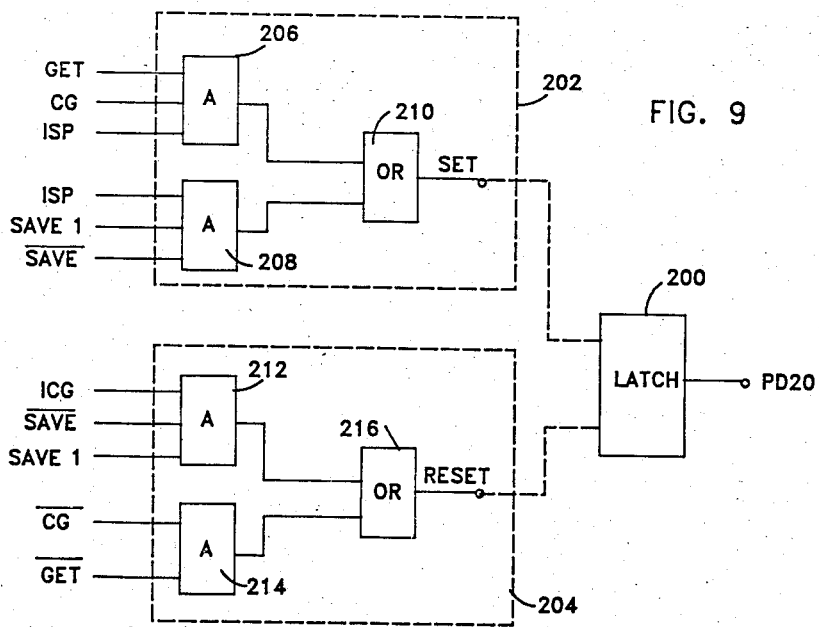
FIG. 9 shows a logic diagram for the CG power down logic.

FIG. 9 shows the details of the CG power down logic means 72 (FIG. 1). As stated before, the function of the CG power down logic means is to generate the control signal identified as PD 20. The signal indicates to the CG power down circuit 56 (FIG. 1) when the voltage at the output of the CG charge pump needs to be adjusted to a desired level.

With reference to FIGS. 1 and 2 for the moment, with the falling edge of the "SAVE" signal, the logic generates the PD 20 signal and sends it to the power down circuit 56 to discharge the control gate. The signal (PD 20) falls again when the rise of ICG indicates that the new desired level (8.5 volts) has been reached. When "GET" is high, PD 20 stays high, pulling CG to ground and holding it there. When "GET" falls, PD 20 falls, thereby enabling the control gate to begin recharging.

The CG power down logic is comprised of latch 200. The latch is connected by a set conductor to combinatorial logic 202 and by a reset conductor to combinatorial logic 204. Combinatorial logic 202 is comprised of AND circuits 206 and 208. The output of the AND circuits is coupled by conductors to the input of OR circuit 210. The output from OR circuit 210 is connected to the set conductor. Likewise, combinatorial logic 204 is comprised of AND circuit 212 and 214. The AND circuits are coupled over conductors to OR circuit 216. The output from OR circuit 216 is tied to the reset conductor. The combinatorial logic 202 and 204 monitors a plurality of input control signals (previously described) and sets latch 200 at the appropriate time so that PD 20 is properly activated.

While the invention has been particularly shown and described with reference to the preferred embodiments thereof, it will be understood by those skilled in the art that various changes in form and details may be made therein without departing from the spirit and scope of the invention.

Having thus described our invention, what we claim as new, and desire to secure by Letters Patent is:

1. An on-chip voltage generating system for providing a plurality of different voltages to drive an integrated circuit (IC) chip comprising:

a first charge pump means having an output for supplying a plurality of different voltages;

a second charge pump means having an output for supplying a plurality of different voltages;

a first control means coupled to the first charge pump;

a second control means coupled to the second charge pump;

each of said first and second control means being responsive to an externally generated mode control signal and operable for sensing the voltage level at the output of its respective charge pump and for generating a first set of control signals for controlling said charge pump and a second set of control signals;

a first power down control means; and a second power down control means, each of said power down control means being responsive to the second set of control signals and operable to adjust the voltage level at the output of its respective charge pump.

2. The on-chip voltage generating system of claim 1 wherein the IC chip includes a non-volatile dynamic RAM cell having a storage plate (SP) coupled to the output of the first charge pump means and a control gate (CG) coupled to the output of the second charge pump means.

3. The on-chip voltage generating system of claim 1 wherein the first charge pump means includes a first charge pump having an output conductor and a signal feedback conductor;

a programmable oscillator having a port to receive a feedback signal and an output coupled to the charge pump.

4. The on-chip voltage generating system of claim 1 wherein the second charge pump means includes a charge pump having a power down input, an output and a feedback conductor; and a programmable oscillator having a port to receive a feedback signal and an output coupled to the charge pump.

5. The on-chip voltage generating system of claim 1 wherein the first power down control means includes a power down circuit having an output connected to the first charge pump;

a first logic circuit having a first output connected to the power down circuit and a second output; a second logic circuit connected to the second output and having an output connected to the power down circuit.

6. The on-chip voltage generating system of claim 1 wherein the second power down control means includes a power down circuit; and a power down logic circuit connected to said power down circuit.

7. An on-chip voltage generating system for providing a plurality of different voltages to drive an integrated circuit module having a storage plate (SP) and a control gate (CG) comprising:

a first charge pump means having an output coupled to the SP;

a second charge pump means having an output coupled to the CG;

a first control circuit means coupled to the first charge pump means;

a second control circuit means coupled to the second charge pump means;

each of said second and first control circuit means being responsive to signals representative of a desired module state and operable for sensing the voltage at the output of its respective charge pump and generating control signals;

logic circuit means operable for monitoring the control signals and for generating enabling signals representative of a desired voltage level;

a first power down control means coupled to the first charge pump means; and a second power down control means coupled to the second charge pump means;

each of said first and second power down control means being responsive to the enabling signals and operable to adjust the output voltage level at its respective charge pump means.

* * * * *